(12) United States Patent
Liu

(10) Patent No.: US 6,924,711 B2
(45) Date of Patent: Aug. 2, 2005

(54) MULTIMODE MODULATOR EMPLOYING A PHASE LOCK LOOP FOR WIRELESS COMMUNICATIONS

(75) Inventor: Dongtai Liu, Fremont, CA (US)

(73) Assignee: UTStarcom, Inc., Alameda, CA (US)

( * ) Notice: Subject to any disclaimer, the term of this patent is extended or adjusted under 35 U.S.C. 154(b) by 29 days.

(21) Appl. No.: 10/386,352

(22) Filed: Mar. 10, 2003

(65) Prior Publication Data

US 2003/0227342 A1 Dec. 11, 2003

Related U.S. Application Data

(60) Provisional application No. 60/387,234, filed on Jun. 7, 2002.

(51) Int. Cl.[7] .................................................. H03C 1/00
(52) U.S. Cl. ........................ 332/159; 332/160; 332/162; 330/149; 455/126
(58) Field of Search .......................... 330/149; 332/159, 332/160, 162, 145, 161; 455/126; 375/376; 327/105, 156

(56) References Cited

U.S. PATENT DOCUMENTS 6,236,267 B1 * 5/2001 Anzil .......................... 330/149
6,384,677 B2   5/2002 Yamamoto

\* cited by examiner

Primary Examiner—Arnold Kinkead
(74) Attorney, Agent, or Firm—Felix L. Flacher (57) ABSTRACT

A phase-amplitude modulator for mobile communications employs a phase lock loop as an input to a nonlinear power amplifier providing phase information with amplitude information used to modulate the power amplifier output to synthesize phase-amplitude for the RF transmission signal.

19 Claims, 6 Drawing Sheets

MULTIMODE MODULATOR EMPLOYING A PHASE LOCK LOOP FOR WIRELESS COMMUNICATIONS

CROSS-REFERENCE TO RELATED APPLICATIONS

This application claims priority of the Provisional Application Ser. No. 60/387,234 of the same title filed on Jun. 7, 2002.

BACKGROUND OF THE INVENTION

1. Field of the Invention

This invention relates generally to the field of modulators for Phase Amplitude Modulation (such as QAM or QPSK) transmission signal generation. More particularly, the invention provides a Phase-Amplitude modulator using a phase lock loop (PLL) to drive the power amplifier (PA) with phase and amplitude provided by either quadrature or polar input signals resulting in a low-cost, high power efficiency transmission solution for wireless communications.

2. Description of Related Art

Figure 1:
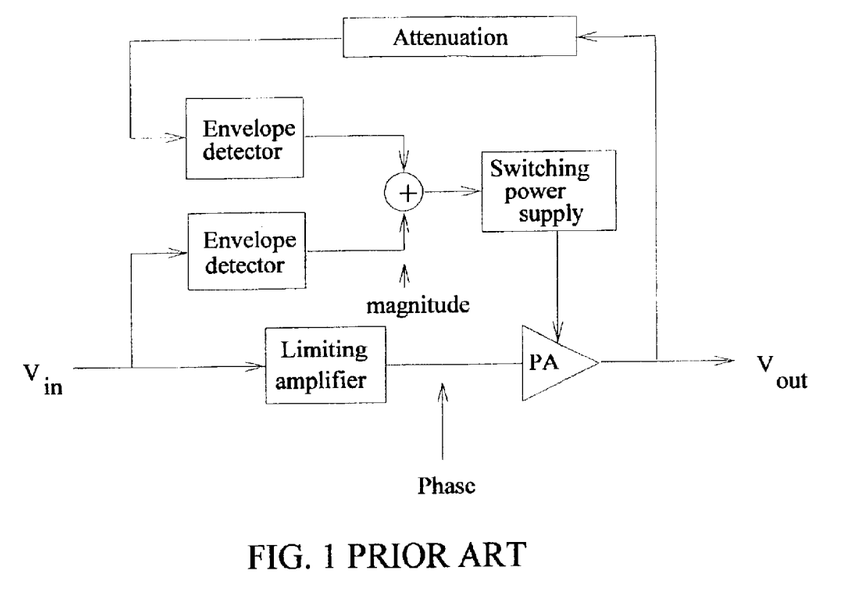
FIG. 1 is a schematic depiction of prior art Envelope Elimination and Restoration technology.

As early as the 1950's, an "Envelop Elimination & Restoration" scheme was practiced in transmitter technology, mainly to raise the RF power amplifier efficiency. This is described in detail by Leenaerts, et al (*Circuit Design for RF Transceivers*, ISBN 0-7923-7551-3). The scheme, illustrated in FIG. 1, provides an alternative to traditional methods for adding the amplitude information at the power amplifier stage.

Figure 2:
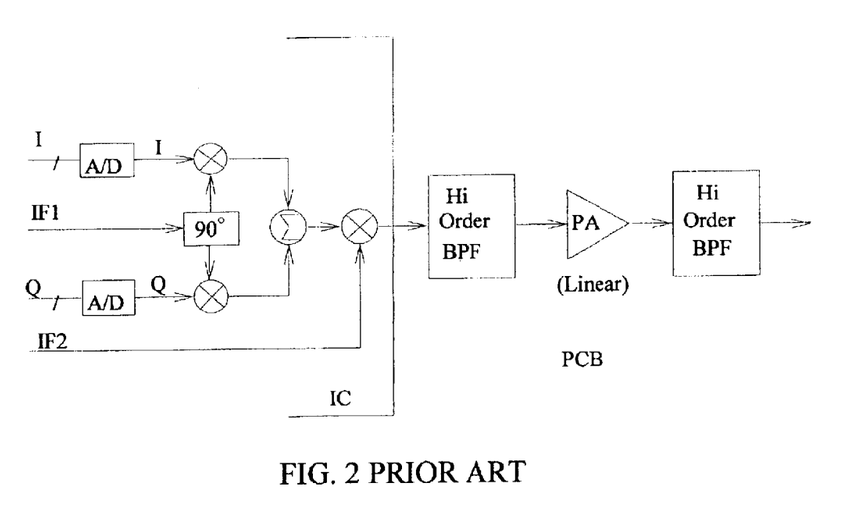
FIG. 2 is a schematic depiction of a traditional QPSK/QAM transmitter.

Traditional Quadrature Phase Shift Keying (QPSK) and Quadrature Amplitude Modulation (QAM) transmitters consist of a quadrature I/Q modulator, depicted by FIG. 2, an up-converter and a linear RF power amplifier. A highly linear RF power amplifier is required, and a hi-order, low-loss band-pass filter is needed before the antenna to remove the side band signals as a result of the up-conversion. Both components are expensive, and both cause low power efficiency.

It is, therefore, desirable to provide modulation devices that could result in lower cost and higher power efficiency transmitters for QPSK and QAM signals for wireless applications.

SUMMARY OF THE INVENTION

The modulator of the present invention uses the output of a phase lock loop (PLL) to drive the power amplifier (PA). Because of the continuous phase of the PLL, the frequency spectrum of the PLL output contains very low spurious power. The amplitude information is added by modulation of the PA output, thereby synthesizing the phase-amplitude. In the structure of the invention, the phase of the input signal is employed to create the IF signal input to the phase detector (PD) of the PLL. The output of the PLL is connected to the PA. The input signal amplitude is then employed for modulating the gain of the PA to synthesize the RF output.

BRIEF DESCRIPTION OF THE DRAWINGS

These and other features and advantages of the present invention will be better understood by reference to the following detailed description when considered in connection with the accompanying drawings wherein.

DETAILED DESCRIPTION OF THE INVENTION

Figure 3:
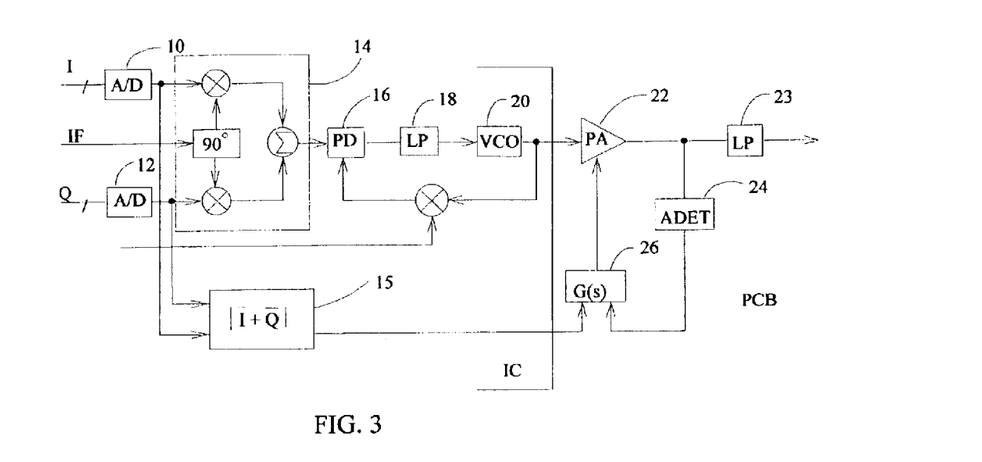
FIG. 3 is a schematic for a first embodiment of the present invention employing quadrature phase and amplitude information.

Referring to the drawings, FIG. 3 illustrates a first embodiment of the invention. In this embodiment, the I/Q baseband vectors are used to create a precise phase-modulated intermediate carrier frequency (IF) by the means of a quadrature modulator employing analog to digital converters (A/D) 10 and 12 and phase shift architecture 14. The resulting IF from the quadrature modulator then feeds the reference phase input of phase detector (PD) 16 of a PLL. The PD output signal is conditioned by low pass filter (LP) 18. The oscillator frequency (OF) signal is mixed in the feedback loop and the voltage controlled oscillator (VCO) 20 output produces an up-converted frequency that is the sum of IF+OF, and preserves the original phase information of the I/Q signals. This signal then drives a PA 22. A non-linear PA is used with a low-pass harmonic filter 23, instead of a more expensive high order band pass filter to take advantage of the PLL's purer output spectrum.

The amplitude information of the input signal, essentially proportional to the magnitude of vector I+Q, is introduced at the PA by gain variation or output rail limiting in alternative embodiments. For the embodiment shown in FIG. 3, an amplitude generator 15 determines the amplitude from the outputs of the A/D converters. Since most PAs have varying gain and linearity characteristics, the closed-loop control is provided for the amplitude in the embodiment shown in FIG. 3. This is done with an amplitude detector (ADET) 24 (implemented in various embodiments as an RF diode) and an analog transfer function (G(s)) 26 (implemented in various embodiments as an operational amplifier).

Figure 7:
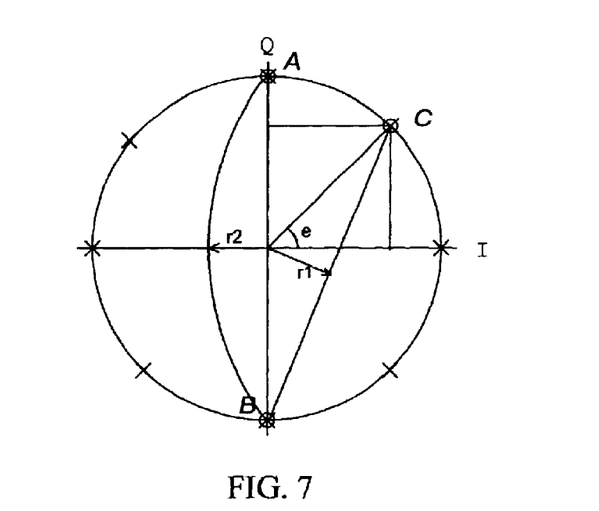
FIG. 7 is a quadrature plot of QPSK amplitudes for an embodiment of the invention; and, FIG. 8 is a data plot for carrier and envelope data and the resulting signal output in a SPICE simulation using a multimode modulator according to the present invention as embodied in FIG. 3.

For the I/Q scheme in FIG. 3, the PLL modulating signal contains amplitude information. For some modulation types, such as QPSK, the amplitude can momentarily become near zero. To avoid splash caused by the missing phase edges during phase transition, the I/Q carrier transition paths should avoid "zero" or "near zero" amplitude. For example, a transition from point A to point B shown in FIG. 7 would produce a zero amplitude in IF momentarily. In the figure, r1 is the minimum carrier amplitude for Pi/4 QPSK, which is always not zero and r2 is the minimum carrier amplitude of an altered trace in a QPSK that does not cross the origin (known in the art as "Offset QPSK). The I/Q vector is modified to go around the origin so that at least there is a minimum magnitude r2. Optimum employment of the present invention uses Offset QPSK or alternatively QAM, GMSK or other non-zero crossing modulation techniques.

Figure 4A:
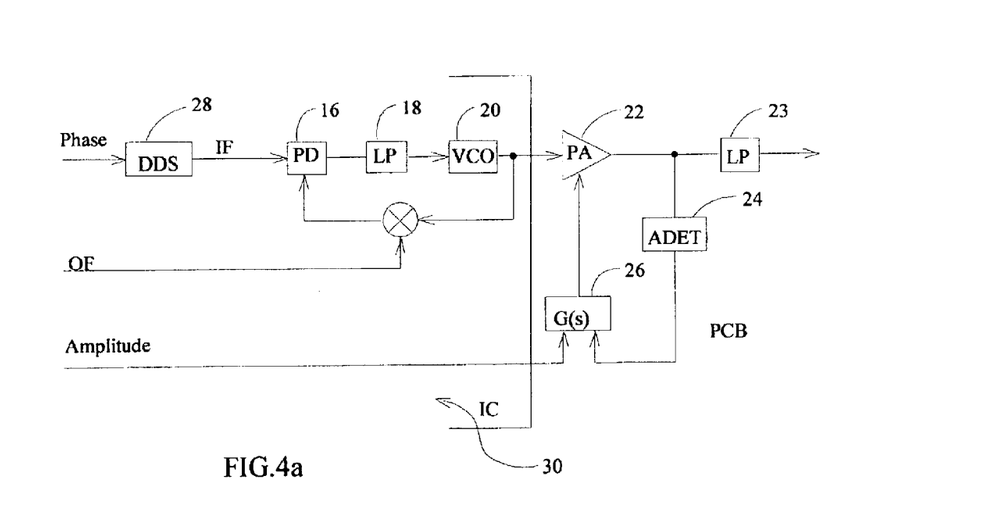
FIG. 4a is a schematic for a second embodiment employing polar phase and amplitude signal information with a direct digital synthesizer for IF generation.

FIG. 4a shows a second embodiment of the present invention better suited for silicon implementation. In the embodiment shown, the I/Q vectors are not used at all, thus eliminating the requirement for the A/D converters for the I/Q analog signal. The Phase-amplitude information is used in polar form, i.e. the phase angle and magnitude. A direct-digital synthesizer (DDS) 28 receives the Phase signal and generates the IF signal provided to the PLL elements (PD 16, LP 18 and VCO 20).

Figure 4B:
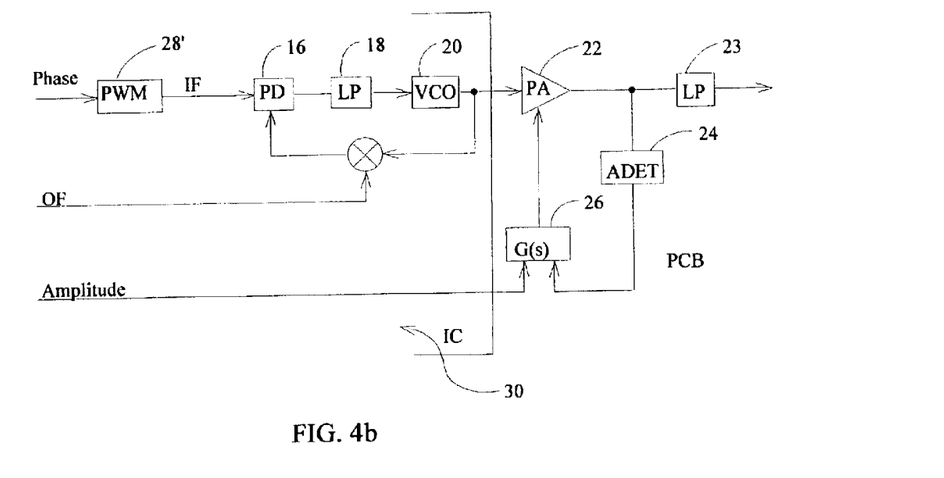
FIG. 4b is a schematic for the second embodiment employing polar phase and amplitude signal information with a pulse width modulator for IF generation.
Figure 4C:
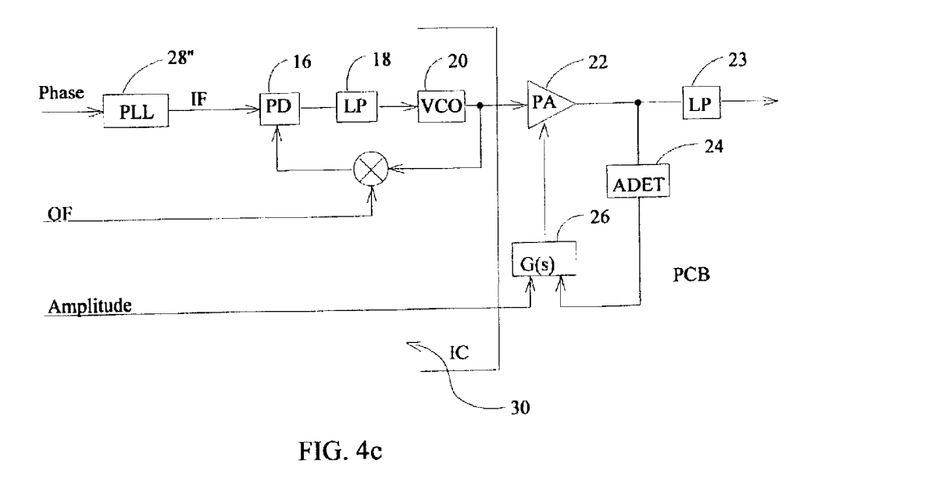
FIG. 4c is a schematic for the second embodiment employing polar phase and amplitude signal information with a phase lock loop for IF generation.

FIG. 4b shows the second embodiment wherein the DDS is replaced with a pulse width modulator (PWM) 28' to provide digital synthesis of the phase to create the IF signal for the PLL. In another alternate embodiment shown in FIG. 4c, a second PLL 28" is used in place of the DDS. The DDS or the alternatives of a PWM or second PLL and the PD, LP and VCO components of the PLL are contained on integrated circuit (IC) 30.

Figure 5:
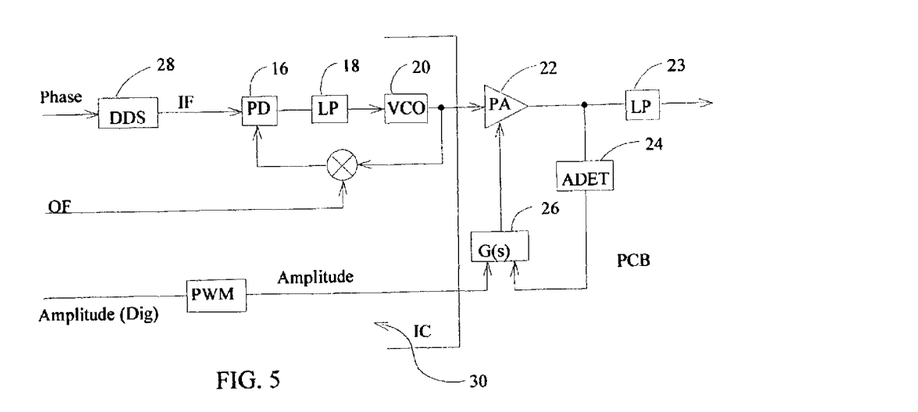
FIG. 5 is a schematic for an alternative embodiment of the polar vector embodiment.

The embodiment of FIG. 5 enhances the cost reduction possible with the present invention by integrating the amplitude modulation function using a pulse width modulator (PWM) 32 onboard the IC which eliminates the necessity of converting digital amplitude information to analog prior to introduction to the circuit.

Figure 6:
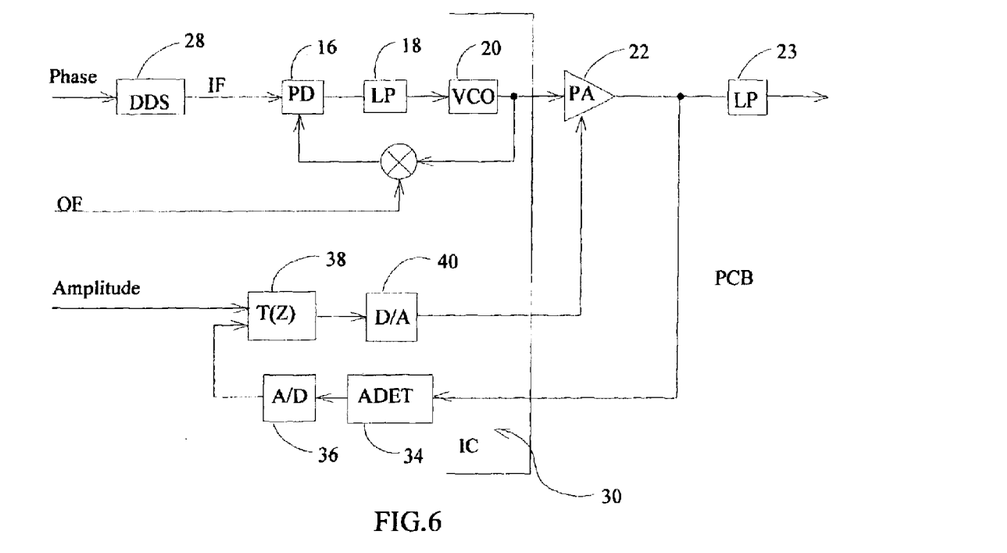
FIG. 6 is a schematic for a second alternative embodiment of a fully integrated polar vector modulator employing the present invention.

FIG. 6 shows an alternative embodiment wherein the components for the amplitude detection and transfer function generation for the PA control are implemented on the IC. The ADET 34 receives the signal from the PA and its output is routed through an A/D 36. The digitized signal is mixed with the amplitude in a digital function generator (T(z)) 38 which is then passed through digital to analog converter (D/A) 40 to provide the feedback signal for the PA.

Figure 4D:
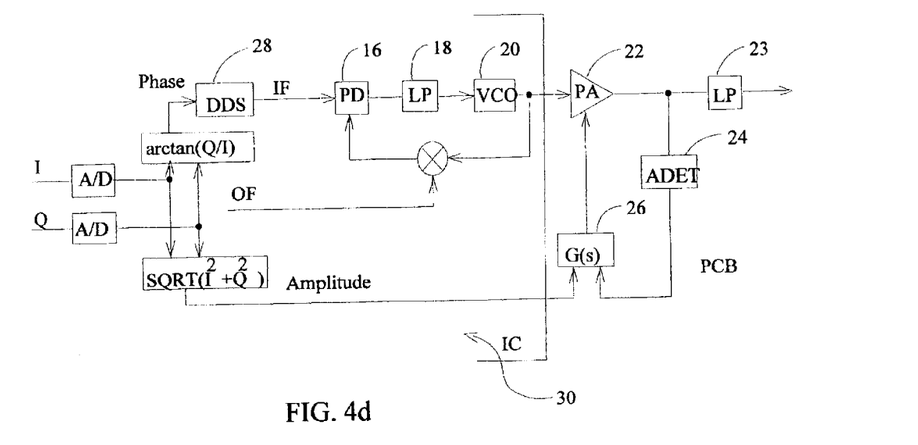
FIG. 4d is a schematic for the second embodiment demonstrating baseband filtering of the I/Q signals for polar phase and amplitude signal information for spectrum shaping.

For other embodiments, as an alternative to PA gain modulation, the amplitude modulation can also be accomplished by altering the power supply voltage on the PA transistor; changing the input matching parameters or using a RF attenuator. Also, the spectrum shaping can be achieved by deriving the phase and amplitude from the original I/Q signals to maintain the spectral requirement, using the formula Phase=Arctan(Q/I), Amplitude=SQRT($I^2+Q^2$) as shown in FIG. 4d. In addition, partial filtering on the phase can also be done in the PLL's low-pass filter.

Figure 8:
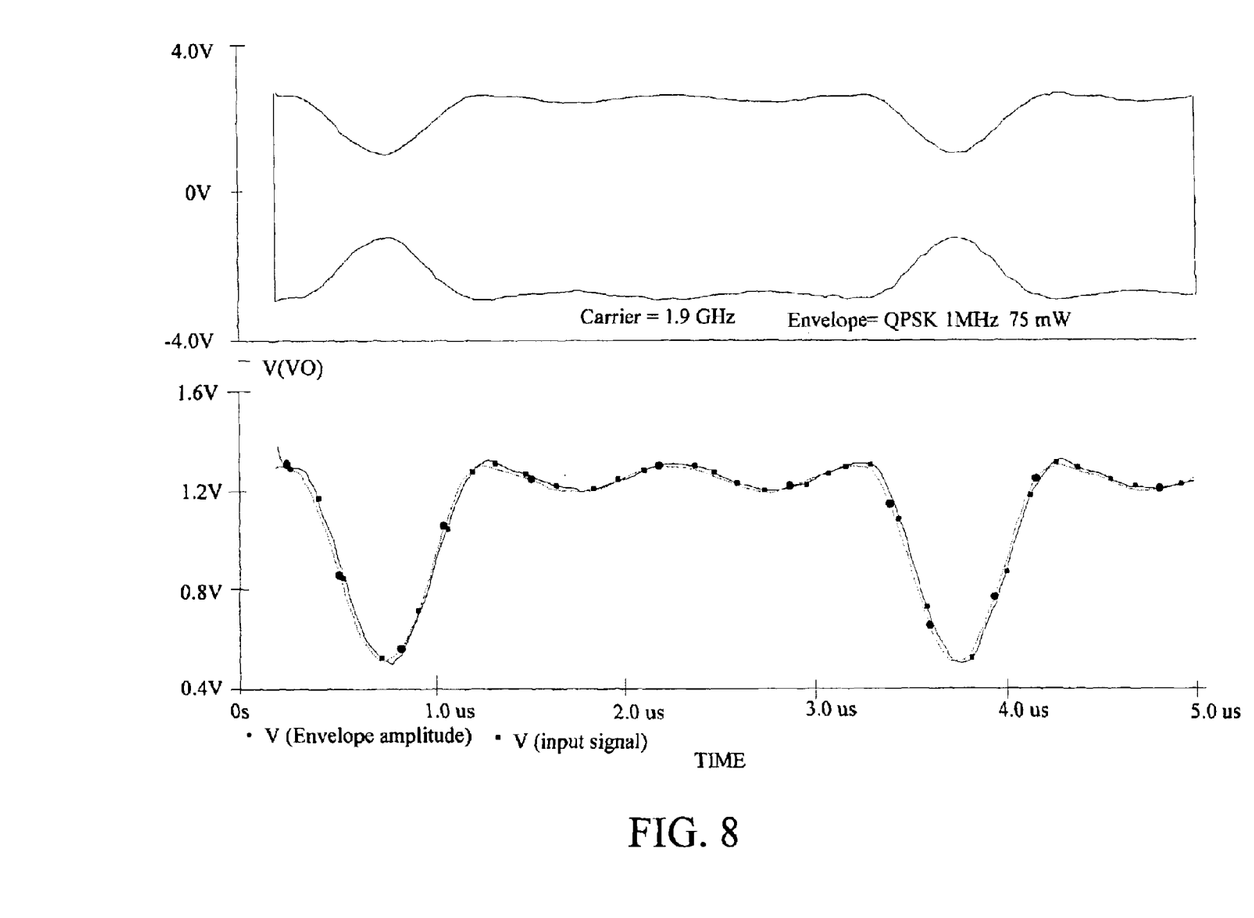

SPICE simulation of an embodiment of the present invention as shown in FIG. 3 demonstrates the efficacy of the circuit. In the simulation shown in FIG. 8, the carrier frequency in the model is 1900 MHz with a QPSK symbol rate of 1 MHz as shown in trace 42. The fidelity of the modulation employing the present invention is shown in the comparison of the input signal of the base band I/Q amplitude provided in plot 44 shown with respect to the resultant amplitude envelope of the 1900 MHz carrier shown as signal 46.

Having now described the invention in detail as required by the patent statutes, those skilled in the art will recognize modifications and substitutions to the specific embodiments disclosed herein. Such modifications are within the scope and intent of the present invention as defined in the following claims.

What is claimed is:

1. A phase-amplitude modulator for an input signal comprising:
    a phase lock loop (PLL) receiving at an input phase information from an input signal and providing an output;
    a power amplifier (PA) receiving the output from the PLL, the PA modulated by an amplitude of the input signal to synthesize an RF transmission signal and wherein a closed loop control on the PA is used to obtain modulation accuracy;
    an amplitude detector connected to an output of the PA; and
    an analog transfer function (G(s)) receiving the amplitude of the input signal and a feedback output from the amplitude detector, an output of the transfer function modulating the PA.

2. A modulator as defined in claim 1 wherein the amplitude of the input signal is digital and further comprising a pulse width modulator (PWM) receiving the digital amplitude and providing the amplitude to the analog transfer function.

3. A modulator as defined in claim 1 wherein a closed loop control on the PA is used to obtain modulation accuracy and the amplitude of the input signal is digital and further comprising:
    an amplitude detector connected to an output of the PA;
    a first analog to digital converter receiving an output of the amplitude detector:
    a digital transfer function (T(Z)) receiving the digital amplitude and an output of the first analog to digital converter; and,
    a digital to analog converter receiving an output from the digital transfer function, an output of the digital to analog converter modulating the PA.

4. A modulator as defined in claim 1 wherein the input signal is in quadrature format and further comprising:
    a first analog to digital converter receiving an I baseband vector;
    a second analog to digital converter receiving a Q baseband vector;
    a phase shifter receiving an output from the first analog to digital converter, an output from the second analog to digital converter and an intermediate carrier frequency, the phase shifter connected to the phase lock loop to provide the phase angle information; and,
    an amplitude generator receiving the output of the first analog to digital converter and the output of the second analog to digital converter and providing an amplitude of the input signal.

5. A modulator as defined in claim 1 wherein the PA is non-linear to obtain higher power efficiency further comprising a low pass harmonic filter connected to the output of the PA for filtering the RF transmission signal.

6. A modulator as defined in claim 1 further comprising a direct digital synthesizer (DDS) receiving the phase information of the input signal, the DDS generating an IF signal as the input of the PLL wherein baseband filtering is done on the phase and amplitude separately to obtain the desired spectrum.

7. A modulator as defined in claim 6 wherein the phase filtering is done by filtering the DDS's phase angle.

8. A modulator as defined in claim 6 where the phase filtering is done in a low-pass filter in the PLL.

9. A modulator as defined in claim 1 further comprising a pulse width modulator (PWM) receiving the phase information of the input signal, the PWM generating an IF signal as the input of the PLL.

10. A modulator as defined in claim 1 further comprising a second PLL receiving the phase information of the input signal, the second PLL generating an IF signal as the input of the PLL.

11. A phase-amplitude modulator for an input signal comprising:

a digital synthesizer receiving the phase information of an input signal, the digital synthesizer generating an IF signal;

a phase lock loop (PLL) receiving the IF signal at an input and providing an output;

a non-linear power amplifier (PA) receiving the output from the PLL and generating an RF transmission signal;

an amplitude detector connected to an output of the PA; and an means for creating an analog transfer function (6(s)) receiving an amplitude of the input signal and a feedback output from the amplitude detector, an output of the transfer function means modulating the PA.

12. A modulator as defined in claim 11 wherein the digital synthesizer comprises a direct digital synthesizer (DDS).

13. A modulator as defined in claim 11 wherein the digital synthesizer comprises a pulse width modulator (PWM).

14. A modulator as defined in claim 11 wherein the amplitude of the input signal is digital and further comprising a pulse width modulator (PWM) receiving the digital amplitude and providing the amplitude to the analog transfer function.

15. A phase-amplitude modulator for an input signal comprising:

a digital synthesizer receiving phase information of an input signal, the digital synthesizer generating an IF signal;

a phase lock loop (PLL) receiving the IF signal at an input and providing an output;

a non-linear power amplifier (PA) receiving the output from the PLL and generating an RE transmission signal; an amplitude detector connected to an output of the PA;

a first analog to digital converter receiving an output of the amplitude detector:

a digital transfer function (T(Z)) receiving a digital amplitude signal and an output of the first analog to digital converter; and, a digital to analog converter receiving an output from the digital transfer function, an output of the digital to analog converter modulating the PA.

16. A modulator as defined in claim 15 wherein the digital synthesizer, the PLL, the first analog to digital and the digital to analog converters, the amplitude detector and the digital transfer function are contained on a single integrated circuit.

17. A modulator as defined in claim 12 wherein the amplitude of the input signal is digital and further comprising a pulse width modulator (PWM) receiving the digital amplitude signal and providing an amplitude signal to the analog transfer function.

18. A modulator as defined in claim 17 wherein the DDS, the PLL and the PWM are contained on a single integrated circuit.

19. A phase-amplitude modulator for a quadrature format input signal comprising:

a first analog to digital converter receiving an I baseband vector;

a second analog to digital converter receiving a Q baseband vector, a phase shifter receiving an output from the first analog to digital converter, an output from the second analog to digital converter and an intermediate carrier frequency, the phase shifter providing as an output a phase angle signal;

a phase lock loop (PLL) receiving at an input the phase angle signal and providing an output;

a non-linear power amplifier (PA) receiving the output from the PLL and synthesizing an RF transmission signal through a low pass harmonic filter;

an amplitude detector connected to an output of the PA; and a means for creating analog transfer function (G(s)) receiving an amplitude of the input signal and a feedback output from the amplitude detector, an output of the transfer function means modulating the PA.

* * * * *

UNITED STATES PATENT AND TRADEMARK OFFICE
CERTIFICATE OF CORRECTION

PATENT NO. : 6,924,711 B2
APPLICATION NO. : 10/386352
DATED : August 2, 2005
INVENTOR(S) : Dongtai Liu It is certified that error appears in the above-identified patent and that said Letters Patent is hereby corrected as shown below:

Column 5, Line 24         Delete "an" and insert --a--
Column 5, Line 24         Delete "6" and insert --G--
Column 5, Line 45         Delete "RE" and insert --RF--

Signed and Sealed this

Sixth Day of March, 2007

JON W. DUDAS
*Director of the United States Patent and Trademark Office*